United States Patent

[11] 3,629,623

[72] Inventors Michio Sakurai
Nagoya;
Yoshichi Kawashima, Gifu-shi, both of Japan
[21] Appl. No. 853,708
[22] Filed Aug. 28, 1969
[45] Patented Dec. 21, 1971
[73] Assignee Nippon Denso Kabushiki Kaisha
Kariya-shi, Japan
[32] Priority Nov. 1, 1968
[33] Japan
[31] 43/95694

[54] COMPOSITE SEMICONDUCTOR DEVICE AND SEMICONDUCTOR VOLTAGE REGULATOR DEVICE FOR VEHICLES
5 Claims, 11 Drawing Figs.

[52] U.S. Cl. .......... 307/303, 307/315, 317/235 D, 323/22 T
[51] Int. Cl. .......... H03k 3/26
[50] Field of Search .......... 307/303, 315; 317/235 (22 D); 323/22 T

[56] References Cited

UNITED STATES PATENTS

| | | | |
|---|---|---|---|
| 2,663,806 | 12/1953 | Darlington .......... | 307/303 X |
| 3,103,599 | 9/1963 | Henkels .......... | 307/315 X |
| 3,500,140 | 3/1970 | Makimoto et al. .......... | 307/315 X |

*Primary Examiner*—Stanley D. Miller, Jr.
*Attorney*—Cushman, Darby & Cushman

ABSTRACT: A composite semiconductor element formed in a thick film comprising a plurality of circuit units and functioning as a multi-input switching circuit or a multi-input logic circuit, each unit being mainly composed of two transistors connected in Darlington connection with a common collector region. This composite semiconductor element is especially useful for voltage regulators for vehicles.

COMPOSITE SEMICONDUCTOR DEVICE AND SEMICONDUCTOR VOLTAGE REGULATOR DEVICE FOR VEHICLES

BACKGROUND OF THE INVENTION

1. Field of the Invention

This invention relates to composite semiconductor elements and more particularly to a composite semiconductor element integrated in a thick film and functioning as a multi-input switching circuit or a multi-input logic circuit.

The composite semiconductor element according to this invention is particularly useful as an integrated voltage regulator for vehicles.

2. Description of the Prior Art

Conventionally, for integrated switching circuits a plurality of transistors have been employed. However, when there is a need for minimizing the collector-emitter saturation voltage of an output stage transistor which controls the supply current to a load, as is the case of voltage regulators for use in vehicle, the number of diodes used in the circuit increases to such an extent that the integration of the circuit becomes difficult. This is because the volume of a semiconductor pellet required to embody such a switching circuit becomes very large.

In voltage regulators for vehicles, since the field coil of a charging AC generator is made as small as possible for the purpose of miniaturization of the device, the collector-emitter saturation voltage of the output stage transistor of a switching circuit connected to such a field coil is needed to be as low as possible, resulting in a difficulty of integrating the switching circuit.

SUMMARY OF THE INVENTION

An object of the invention is to provide a composite semiconductor device which will eliminate the conventionally experienced drawback as mentioned above.

Another object of the invention is to provide an economical and reliable voltage regulator for vehicles comprising a thick film integrated circuit employing said semiconductor device.

In one embodiment of this invention, a semiconductor device comprises at least two units of the same configuration integrally are formed in one semiconductor pellet in such a manner that they are rotationally symmetric with respect to the center axis of the pellet, each unit comprising first and second stage NPN transistors having a common collector region and connected in Darlington connection, the first stage transistor having a leadout portion at its P-type base and another N-type region within the P-type base region in addition to an N-type emitter region, the backward characteristics of the PN-junction at said another N-type region working as a constant voltage diode, the units being connected in parallel so as to make the collector-emitter saturation voltage $V_{CE(SAT)}$ of an output transistor low.

According to the invention, there is obtained such an effect that an output stage transistor can be cut off reliably without using many diodes by utilizing the voltage drop of Darlington connected transistors. Further, since a voltage detecting circuit unit which detects an input voltage has the same structure as a voltage dropping circuit unit, various advantages are obtained as follows:

1. A plurality of semiconductor circuit units can be formed integrally, while maintaining excellent heat dissipation;

2. Since transistors are connected in Darlington connection in a unit, the area of a pellet needed to constitute the device can be kept small and simple even when the number of elements becomes large;

3. Since the Zener diode of the voltage dropping circuit unit does not utilize its inherent Zener characteristics for its proper functions, even those Zener diodes having Zener characteristics that are not so good, or those transistors having saturation characteristics that are not so low, may satisfactorily be employed. Moreover, such diodes and/or transistors may have not so high breakdown voltage. Still further, since a plurality of circuit units are formed integrally, after testing the characteristics of these units one which has the best characteristics can be selected, for example, as a voltage detecting circuit unit, thus improving the yield of manufactured articles;

4. Since the central axis of the pellet constitutes an axis of rotational symmetry of more than one order, a new unit of the same configuration can be positioned at the place by the rotation of the pellet by $\pi$, $\pi/2$, etc. Thus, the automation of the manufacturing process can be very much enhanced. In such a process, defective units can be checked with inking;

5. Further, the output transistor can be easily cut off even under the very severe condition that the collector-emitter saturation voltage $V_{CE(SAT)}$ is kept very low. Moreover, by these effects, a voltage regulator device as a whole can be manufactured at a lower price; and 6. A multi-input power circuit or a logic circuit having a large tolerance with regard to noise and a large fan-out can be formed at a lower price by constructing a plurality of semiconductor units connected in parallel.

DESCRIPTION OF THE PREFERRED EMBODIMENTS

Figure 1:
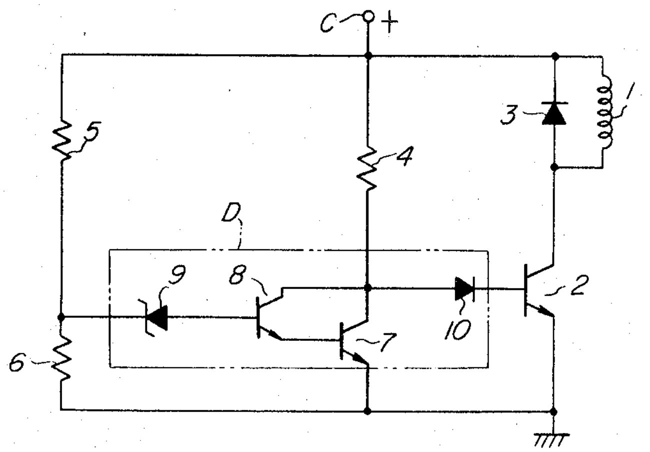
FIG. 1 PRIOR ART
FIG. 1 shows a principal electrical network of a conventional semiconductor voltage regulator for vehicles.

For a better understanding of the invention, first a conventional voltage regulator for vehicle use will be explained in connection with FIG. 1.

The simplest conventional voltage regulator for vehicle comprises the field coil 1 of a charging generator which charges up a storage battery mounted in a vehicle, an output transistor 2 which is connected to the field coil 1 in series and switches on and off the current flowing through the field coil 1, a diode 3 connected in parallel with the field coil 1 for absorbing the reverse electromotive force occurring across both ends of the field coil 1 upon cutting off the field current, a resistance 4 which determines the base current of the output transistor 2, other resistances 5 and 6 for dividing the voltage applied across a storage battery to be connected between a terminal C and the ground, a transistor 7 for controlling the conduction of the output transistor 2, and a constant voltage diode 9 for comparing the voltage at the interconnection point of the voltage dividing resistances 5 and 6 with the Zener breakdown voltage of the diode 9 itself to detect the terminal voltage of the storage battery. In the above simplest structure, the transistor 8 and the diode 10 are dispensed within the circuit of FIG. 1. When integrating such a semiconductor voltage regulator, a transistor 8 is connected to the transistor 7 in Darlington connection in order to minimize the Zener current of the constant voltage diode 9 and to compensate for the thermal dependence of the diode 9 as is shown in FIG. 1, instead of connecting a plurality of diodes in series to and in reverse direction to the diode 9. The voltage drop due to the transistor 8 is compensated by a diode 10 to stably perform the switching action of the transistors 7, 8 and 2. An integrated circuit having its components encircled by a broken line with two dots D has been available as a voltage regulator for vehicles.

However, such conventional voltage regulators can barely cut off the output transistor 2 satisfactorily. This is because the collector-emitter saturation voltage $V_{CE(SAT)}$ of the output transistor 2 is made as low as possible to minimize the dimensions of the field coil 1. Thus, the output transistor 2 cannot satisfactorily be switched on and off unless the collector-emitter saturation voltages of the transistors 7 and 8 are also made sufficiently low.

The easiest way to solve this problem is to connect further diodes in series to the diode 10. But this will make the integration of the circuit enclosed in the broken line D difficult or the area of the semiconductor pellet large, even if such integration is possible.

Figure 2:
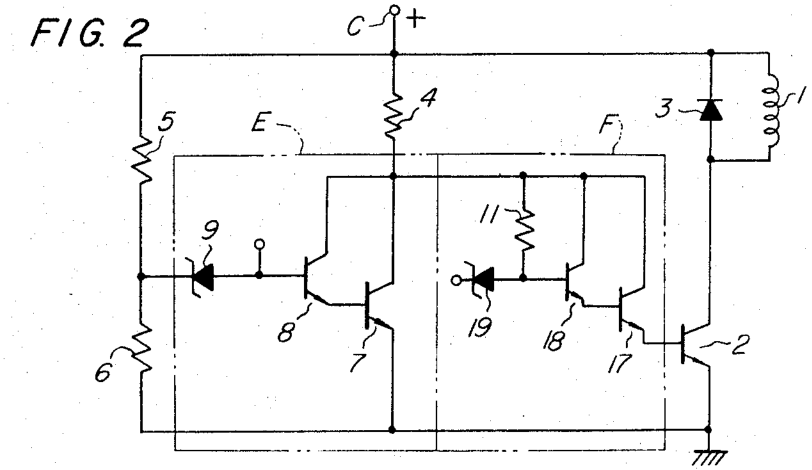
FIG. 2 is a principal electrical connection diagram of a voltage regulator for vehicles employing a composite semiconductor element according to the present invention.

Now, the invention will be explained with reference to the embodiments shown in the drawings, in which like reference numerals indicate like parts. FIG. 2 shows an embodiment of the present composite semiconductor device comprising a voltage detection unit E and a voltage dropping unit F. The voltage detection unit E comprises Darlington connected transistors 7 and 8 and a constant voltage diode 9 while the voltage dropping unit F comprises Darlington connected transistors 17 and 18 and a constant voltage diode 19. The transistor 17 has its emitter connected to the base of an output transistor 2 and the transistor 18 has its base connected to its collector through a resistance 11.

Since the transistors 17 and 18 and the diode 19 are connected in an equivalent configuration as the transistors 7 and 8 and the diode 9, an arbitrary voltage drop not less than that due to the transistors 7 and 8 is available from the transistors 17 and 18 to stably cut off the output transistor 2. If the above network is formed by separate transistors, diodes and resistances, it will surely work satisfactorily but be uneconomical. Economy of manufacturing cost is obtained by forming these elements into a semiconductor pellet with two transistors of a unit connected in Darlington connection.

Figure 3:
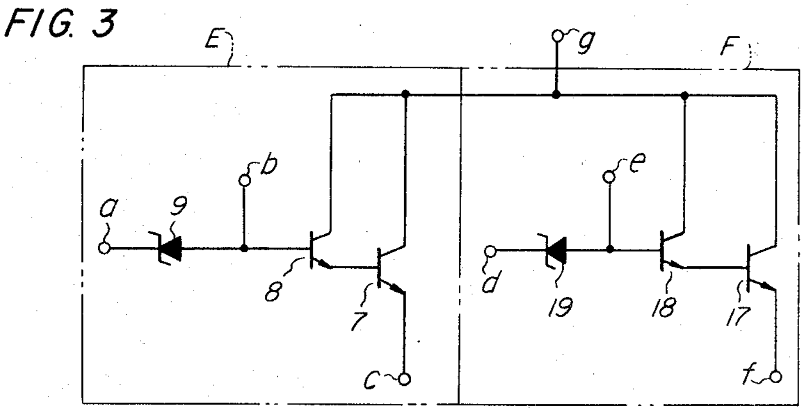
FIG. 3 is a principal electrical connection diagram of a main portion of the composite semiconductor device of FIG. 2
Figure 4:
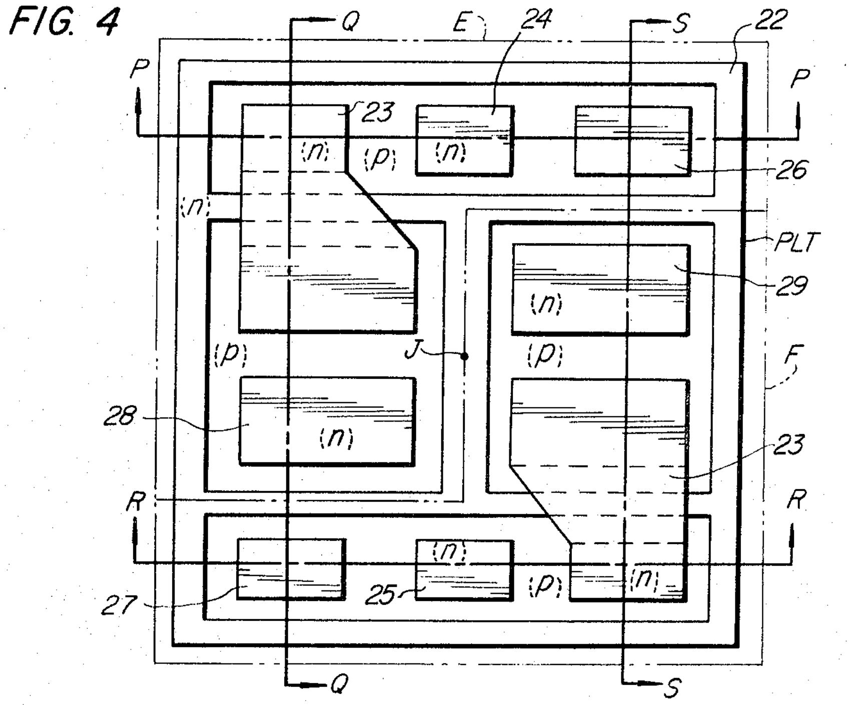
FIG. 4 is a plan view of a solid-state circuit which embodies the electrical network of FIG. 3.
Figure 5:
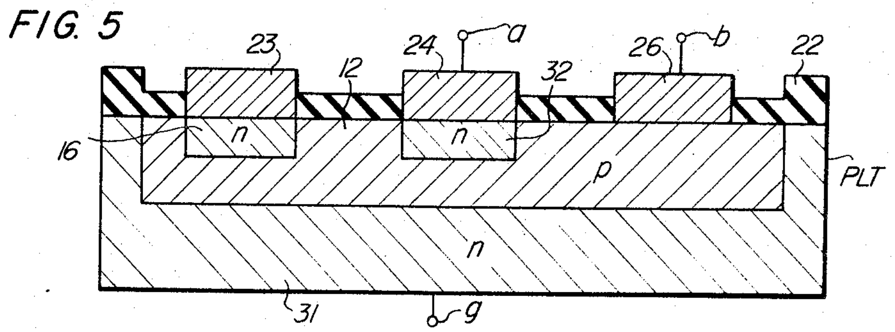
FIGS. 5 to 8 are cross sections along lines P—P, Q—Q, R—R and S—S in FIG. 4, respectively.
Figure 6:
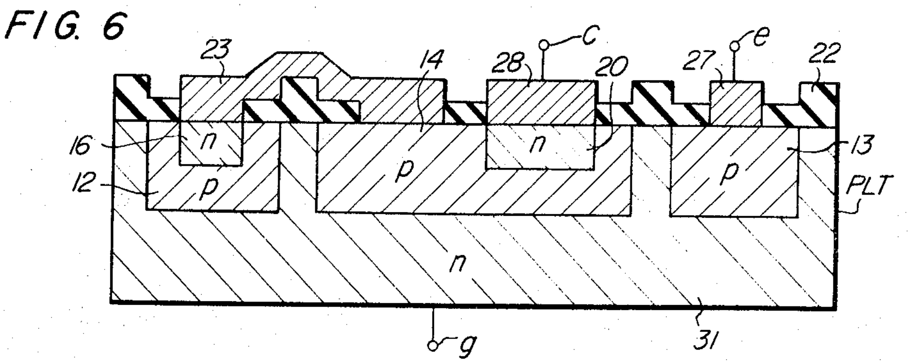
Figure 7:
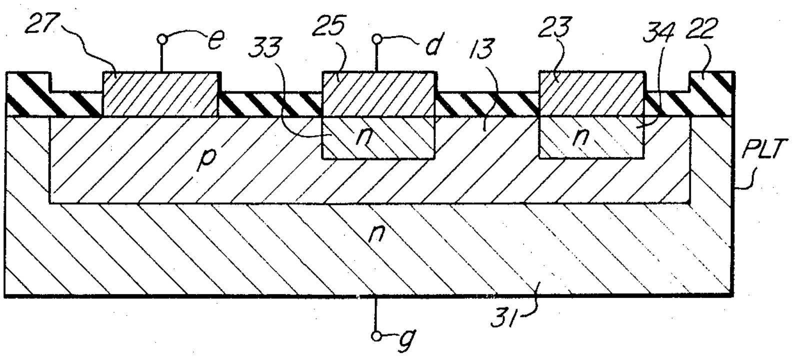
Figure 8:
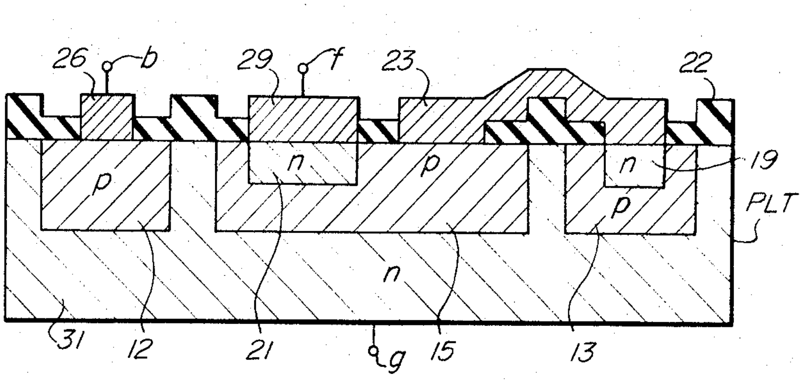

Next, a solid-state circuit embodying the voltage dropping unit F and the voltage detection unit E of FIG. 2 will be explained referring to FIGS. 3 to 8. First, FIG. 3 shows the electrical network of the main portion of the device of FIG. 2. The negative poles of the diodes 9 and 19 are indicated by *a* and *d*, respectively. Also, the base terminals of the first stage transistors 8 and 18 of the Darlington connection are denoted by *b* and *e*, the emitter terminals of the second stage transistors 7 and 17 *c* and *f*, and the common collector terminal of the transistors 7, 8, 17 and 18 *g*, respectively.

In FIGS. 4 to 8, *n* indicates an N-type semiconductor, *p* a P-type semiconductor, and PLT an N-type semiconductor substrate forming the common collector region of the transistors 7, 8, 17 and 18. In the N-type semiconductor substrate, there are diffused P-type regions 12 and 13 to serve as the base of the transistors 8 and 18 and P-type regions 14 and 15 to serve as the base of the transistors 7 and 17. In the P-type base region 12, there are formed two diffused N-type regions, 16 and 32. The *n* region 16 serves as the emitter of the transistor 8. The backward characteristics of the interface of the other N-type region 32 and the P-type region 12 serves as the constant voltage diode 9. In the same manner, two N-type regions 33 and 34 are diffused in the P-type base region 13, the region 34 serving as the emitter of the transistor 18 and the region 33 with the P-type region 13 serving as the constant voltage diode 19. In the P-type base region 14, there is diffused an N-type region 20 which forms the emitter of the transistor 7. Similarly in the P-type region 15, there is diffused a N-type region 21 which serves as the emitter of the transistor 17. The semiconductor substrate is covered with an insulating oxide layer 22. Numeral 23 indicates aluminum deposition layers which electrically connect the N-type emitter regions 16 and 34 of the first stage transistors 8 and 18 with the P-type base regions 14 and 15 of the second stage transistors 7 and 17, respectively, in Darlington connection. Numerals 24 and 25 indicates electrodes consisting of an aluminum layer deposited on the N-type regions 32 and 33. These electrodes are connected to form the terminals *a* and *d*. Numerals 26 and 27 indicate base electrodes of the aluminum layer deposited on the P-type base regions 12 and 13 of transistors 8 and 18, respectively. Numerals 28 and 29 indicate emitter electrodes of the aluminum layer deposited on the N-type emitter regions 20 and 12 of transistors 7 and 17. The common N-type collector region 31 is formed in an $n—n^+$ structure so as to keep the collector saturation resistance low to make the collector-emitter saturation voltage $V_{CE(SAT)}$ of the transistors 7 and 8 and 17 and 18 low. It will be noted that the integrated circuit units E and F are rotationally symmetric, i.e., the unit F could be superimposed on the unit E if it could be rotated around the center axis J of the pellet PLT.

In the embodiment described above, there is used only one diode connected at the base of the first stage transistor having the negative pole connected to the interconnection of voltage dividing resistances. However, there may be employed two constant voltage diodes connected in parallel at the base of a first stage transistor having the negative poles connected to the interconnection point of the resistances as in FIG. 2 and the output terminal of a charging AC generator, respectively, to simultaneously detect the terminal voltage of a storage battery and the output voltage of the generator.

Figure 9:
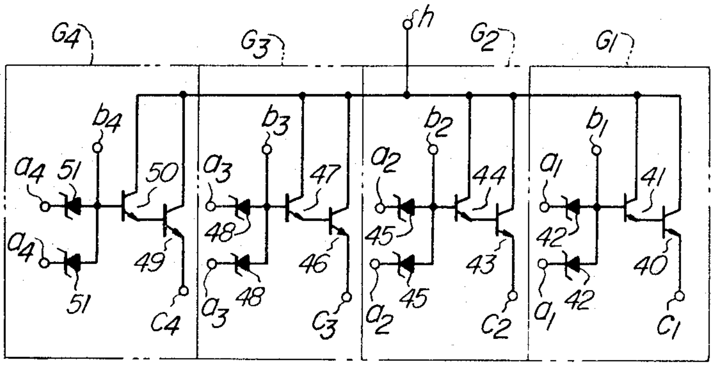
FIG. 9 is an electrical connection diagram of another embodiment of the composite semiconductor device according to this invention.
Figure 10:
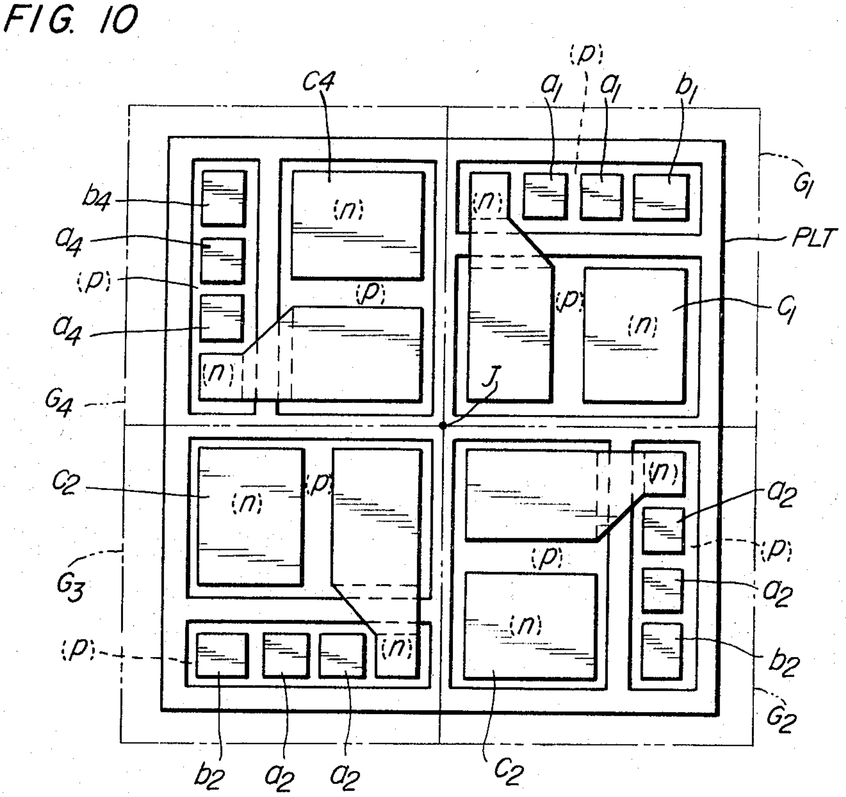
FIG. 10 is a plan view of a solid-state circuit which embodies the electrical network of FIG. 9.

FIG. 9 shows the electrical connection diagram of the main part of another semiconductor voltage regulator comprising four equivalent units $G_1$, $G_2$, $G_3$ and $G_4$ connected in parallel. Further, in this embodiment, two diodes are provided by forming two Zener terminals in the base of each first stage transistors as is indicated at 42, 45, 48 and 51 and $a_1$, $a_2$, $a_3$ and $a_4$. For example, one terminal is connected to a battery terminal and the other to the charging generator. References $b_1$, $b_2$, $b_3$ and $b_4$ indicate the base terminals of first stage transistors 41, 44, 47 and 50, and $c_1$, $c_2$, $c_3$ and $c_4$ the emitter terminals of second stage transistors 40, 43, 46 and 49. As can be seen from FIG. 10, the four units are formed in separated eight P-type islands and in rotational symmetry with respect to the center axis J of the pellet PLT. In FIG. 10, four centrally disposed P-type regions form the bases of the second stage transistors 40, 43, 46 and 49 which are connected to the N-type emitters of the respective first stage transistors with aluminum wiring formed by vacuum deposition or the like. These connections are equivalent to those of the first embodiment shown in FIGs. 5 and 6.

As is apparent from FIGS. 4 to 8 and 10, the elements in a device are not separated individually but have common N-type regions to form a composite semiconductor element or device.

Figure 11:
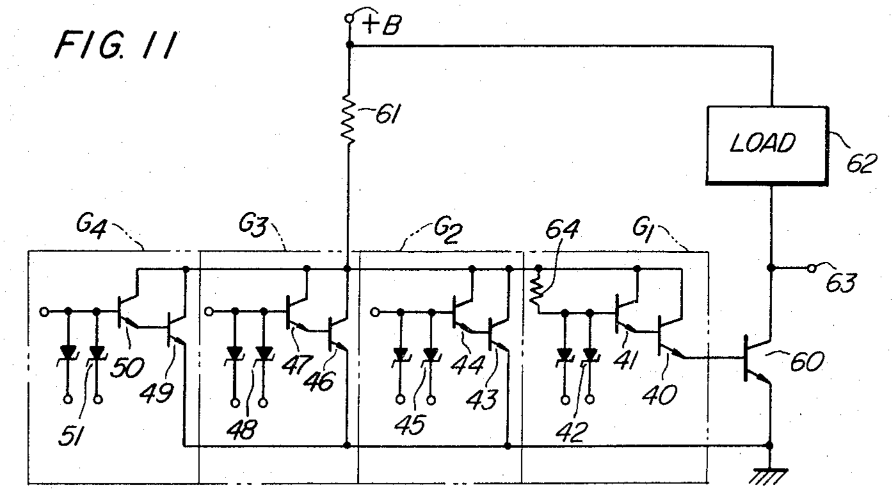
FIG. 11 is an electrical connection diagram of an application of the composite semiconductor device of FIGS. 9 and 10.

FIG. 11 shows an application of the composite semiconductor element shown in FIG. 10. The operation of the circuit of FIG. 11 is the same as that of the conventional voltage regulator described before. For example, when one composite element $G_1$ is used as a voltage dropping circuit, other composite elements $G_2$ to $G_4$ are used as input voltage detecting circuit. A load 62 is connected in series to the collector of an output transistor 60 which is driven by the voltage dropping circuit.

Upon applying an input voltage above a predetermined constant voltage to either one input unit, the unit will cut off the load current by triggering the output transistor.

When the load 62 is substituted by an appropriate resistance and an output terminal 63 is provided at the collector of the output transistor 60, a six-input OR circuit having a large tolerance with respect to noise is obtained. In the case of such logic circuits, theoretically the number of units can be arbitrarily selected. But from the practical viewpoint, circuits of two or four parallel units such as shown in FIG. 3 or 9 are preferable for reasons of economy and ease of manufacture.

We claim:

1. A semiconductor integrated device comprising:

an integrated semiconductor pellet including at least two parallel connected semiconductor circuit units having the same configuration and integrally formed in said semiconductor pellet in rotational symmetry, each unit comprising composite first and second stage integrated transistors connected in Darlington connection and having a common collector region formed of one conductivity type and provided with a respective leadout portion, each of said first and second stage transistors having respective base regions separately disposed on and of opposite conductivity type to said collector region with the first stage one of the base regions being provided with a respective leadout portion, each of said first and second stage transistors further having respective emitter regions of said one conductivity type and being respectively disposed on said base regions with the second stage one of the emitter regions being provided with a respective leadout portion, the first stage one of said emitter regions being electrically connected to the second stage base region to effect said Darlington connection, and for each unit another respective region having a respective leadout portion and being of said one conductivity type and disposed on the respective first stage base region forming therewith a respective PN-junction the backward characteristics of which serve as a Zener diode.

2. A semiconductor integrated device comprising:

an integrated semiconductor pellet including at least two parallel connected semiconductor circuit units having the same configuration and integrally formed in said semiconductor pellet, each unit comprising composite first and second integrated transistor stages connected in Darlington connection and having a common collector region formed of one conductivity type and provided with a leadout portion, each of said first and second transistor stages having respective base regions separately disposed on and of opposite conductivity type to said collector region and having respective emitter regions of said one conductivity type and respectively disposed on said base regions with the second stage one of said emitter regions being provided with respective leadout portions, the first stage one of said emitter regions being electrically connected to the second stage base region to effect said Darlington connection, and for at least one of said units another region having a respective leadout portion and being of said one conductivity type and disposed on and forming with said first stage base region of said one unit a PN-junction the backward characteristics of which serve as a Zener diode.

3. A device as in claim 2 in combination with an output transistor having a base connected to aid emitter region leadout portion for said other unit and a resistance connected between said collector region leadout portion and the base region for said other unit.

4. A device as in claim 2 in combination with:

a voltage divider having two end terminals respectively connected to said collector leadout portion and to both of said emitter leadout portions and a central terminal connected to said leadout portion for said another region, the other of said units having a respective leadout portion from its first stage base region and a resistance coupled therefrom to said collector leadout portion, and an output transistor having a base connected to said emitter region leadout portion for said other unit and having an emitter collector circuit connected across said voltage divider end terminals.

5. A semiconductor voltage regulator device comprising:

an integrated semiconductor pellet including at least two parallel connected semiconductor circuit units having the same configuration and integrally formed in said semiconductor pellet in rotational symmetry, each unit comprising composite first and second stage integrated transistors connected in Darlington connection and having a common collector region formed of one conductivity type and provided with a respective leadout portion, each of said first and second stage transistors having respective base regions separately disposed on and of opposite conductivity type to said collector region with the first stage one of the base regions being provided with a respective leadout portion, each of said first and second stage transistors further having respective emitter regions of said one conductivity type and being respectively disposed on said base regions with the second stage one of the emitter regions being provided with a respective leadout portion, the first stage one of said emitter regions being electrically connected to the second stage base region to effect said Darlington connection, for each unit another respective region having a respective leadout portion and being of said one conductivity type and disposed on the respective first stage base region forming therewith a respective PN-junction the backward characteristics of which serve as a Zener diode;

a charging generator, an output transistor for switching the current from the generator, a voltage dividing network, one of said circuit units having its said leadout portion from the base of the first stage transistor free and said another region thereof being connected to the voltage dividing network, the other unit having the base of the first stage transistor connected to the common collector region and the emitter of the second stage transistor connected to the base of the output transistor, and a resistance connecting the common collector region to a positive pole of the charging generator.

* * * * *

UNITED STATES PATENT OFFICE
CERTIFICATE OF CORRECTION

Patent No. 3,629,623 Dated December 21, 1971

Inventor(s) MICHIO SAKURAI and YOSHICHI KAWASHIMA

It is certified that error appears in the above-identified patent and that said Letters Patent are hereby corrected as shown below:

In the heading, read "Priority Nov. 1, 1968, Japan, 43/95694" as --Priority Nov. 1, 1968, Japan 43/95694; Nov. 2, 1968, Japan, 43/95581--.

Signed and sealed this 31st day of October 1972.

(SEAL)
Attest:

EDWARD M.FLETCHER,JR.
Attesting Officer

ROBERT GOTTSCHALK
Commissioner of Patents